(12) United States Patent
Hunsinger et al.

(10) Patent No.: US 10,897,284 B2
(45) Date of Patent: Jan. 19, 2021

(54) SYSTEM AND METHOD FOR PROGRAMMABLY OPERATING DC LOADS

(71) Applicant: Nextek Power Systems, Inc., Detroit, MI (US)

(72) Inventors: Jeffrey Hunsinger, Northville, MI (US); Paul Savage, Detroit, MI (US); Paul Wickett, Northville, MI (US)

(73) Assignee: NEXTEK POWER SYSTEMS, INC., Detroit, MI (US)

( * ) Notice: Subject to any disclaimer, the term of this patent is extended or adjusted under 35 U.S.C. 154(b) by 0 days.

(21) Appl. No.: 16/740,559

(22) Filed: Jan. 13, 2020

(65) Prior Publication Data

US 2020/0228164 A1    Jul. 16, 2020

Related U.S. Application Data

(60) Provisional application No. 62/792,057, filed on Jan. 14, 2019.

(51) Int. Cl.
| | |
|---|---|
| *H04B 3/54* | (2006.01) |
| *G01R 19/25* | (2006.01) |
| *H02J 13/00* | (2006.01) |
| *G01R 19/165* | (2006.01) |
| *H02J 1/08* | (2006.01) |
| *H02M 3/24* | (2006.01) |

(52) U.S. Cl.
CPC ....... *H04B 3/548* (2013.01); *G01R 19/16528* (2013.01); *G01R 19/2513* (2013.01); *H02J 1/082* (2020.01); *H02J 13/00001* (2020.01); *H02J 13/00002* (2020.01); *H02J 13/0005* (2020.01); *H02M 3/24* (2013.01); *H04B 3/542* (2013.01)

(58) Field of Classification Search
CPC .... H04B 3/548; H04B 3/542; G01R 19/2513; H02J 13/0005; H02J 19/16528; H02J 13/00001; H02J 1/082; H02J 13/00002; H02M 3/24; H02M 3/1582
See application file for complete search history.

(56) References Cited

U.S. PATENT DOCUMENTS

| | | | | |
|---|---|---|---|---|
| 7,044,571 | B2 * | 5/2006 | Smith | B41J 2/04541 347/10 |
| 9,778,712 | B2 * | 10/2017 | Chen | H05K 7/1487 |
| 2008/0138680 | A1 * | 6/2008 | Hu | H01M 16/006 429/431 |

* cited by examiner

*Primary Examiner* — Jean B Corrielus
(74) *Attorney, Agent, or Firm* — Kirschstein, Israel, Schiffmiller & Pieroni, P.C.

(57) ABSTRACT

A system and method for programmably operating a DC load connected to a DC outlet. A power line communication (PLC) client at the outlet measures actual and desired DC voltage at the load. A remotely located DC power server is connected between a DC power source and the outlet. The power server has a PLC master in bidirectional feedback communication with the PLC client to determine the actual and desired DC voltage at the load. An adjustable DC voltage module at the power server is controlled by the PLC master to supply an adjustable DC voltage. The power server adjusts the DC voltage supplied by the voltage module to the load based on the bidirectional feedback communication between the PLC master and the PLC client.

18 Claims, 6 Drawing Sheets

SYSTEM AND METHOD FOR PROGRAMMABLY OPERATING DC LOADS

FIELD OF THE DISCLOSURE

The present disclosure relates generally to a system for, and a method of, programmably operating DC loads, each requiring either only electrical DC power, e.g., DC voltage and current, or both DC power and digital data, to operate.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
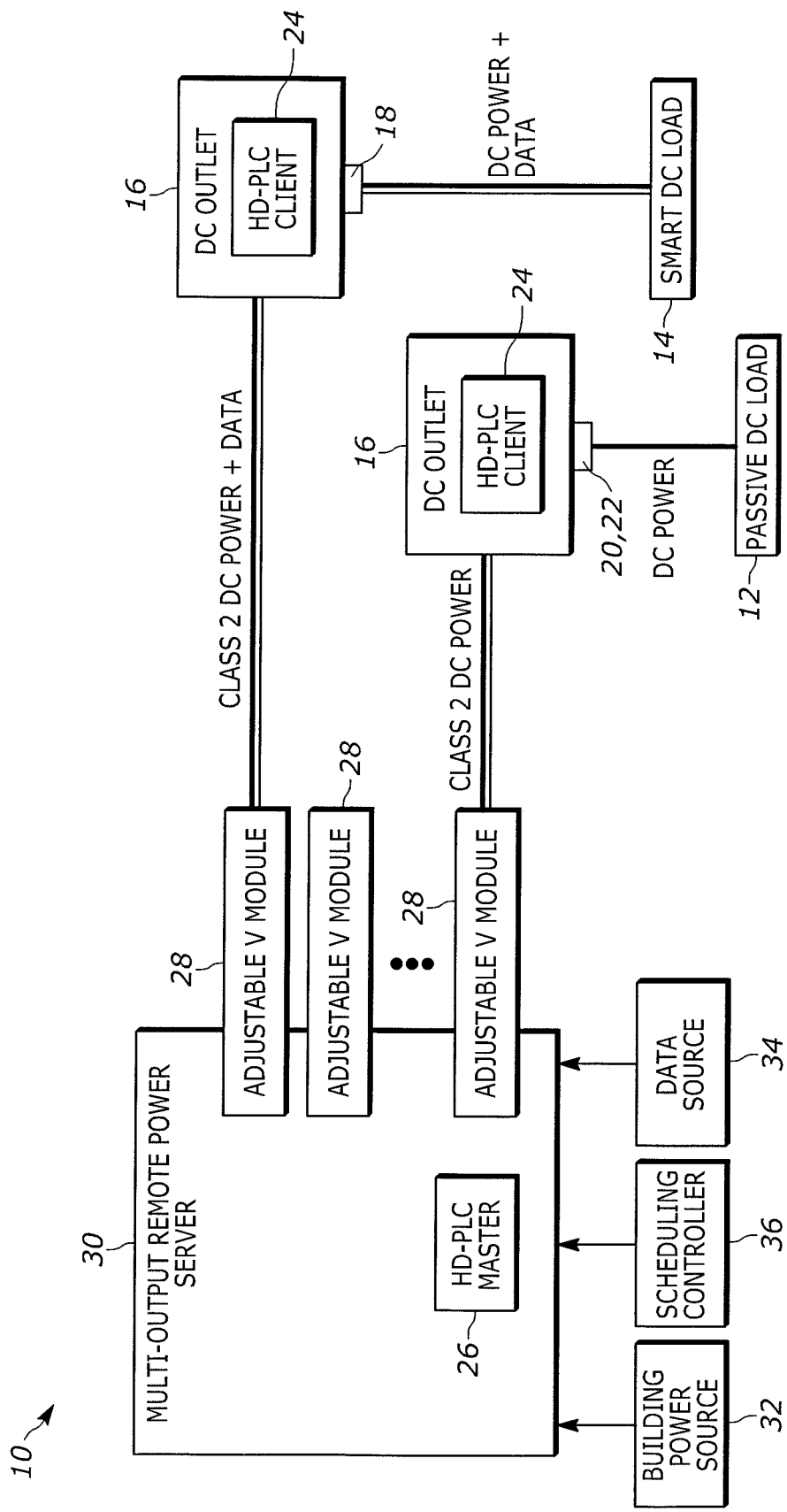
FIG. 1 is a block diagram of the overall system in accordance with the method of the present disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The system components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Turning to FIG. 1 of the drawings, a system 10, in accordance with the method of the present disclosure, is operative for programmably operating one or more DC loads, such as a representative passive DC load 12 requiring only electrical DC power, e.g., DC voltage and current, for its operation, and/or a representative active or smart load 14 requiring both DC power and digital data, e.g., TCP/IP ethernet data, for its operation.

The system 10 comprises one or more DC outlets 16 operatively connected to the loads 12, 14. Each outlet 16 may have one or more connectors, such as a USB-C connector 18 (see embodiment of FIG. 2) for conducting both DC power and digital data to the smart load 14, or a USB-A connector 20 (see embodiment of FIG. 3) for conducting only DC power to the passive load 12, or a barrel connector 22 (see embodiment of FIG. 4) for also conducting only DC power to the passive load 12.

The system 10 further comprises a high definition (HD) power line communication (PLC) client 24 at each outlet 16 for measuring actual and desired DC voltage at each load 12, 14. A DC power server 30 (see FIG. 6) is located remotely from the outlets 16 and is operatively connected between a DC power source 32, such as an office building DC power source, and the outlets 16. The power server 30 may also be operatively connected between a data source 34, such as a wired or wireless network source, for supplying the digital data, and the outlets 16.

The power server 30 has a PLC master 26, preferably of HD-type, in bidirectional feedback communication with each PLC slave or client 24 to determine the actual and desired DC voltage at the respective load 12, 14. The power server 30 further has one or more adjustable DC voltage modules 28 (see FIG. 5) controlled by the PLC master 26 to supply an adjustable DC voltage, preferably in the Class 2 range (less than 24 volts). The power server 30 is operative for adjusting the Class 2 DC voltage supplied by each voltage module 28 to the respective load 12, 14 based on the bidirectional feedback communication between the PLC master 26 and each PLC client 24. Thus, the PLC master 26 and each PLC client 24 talk and communicate with each other through the respective voltage module 28 until the actual DC voltage matches the desired DV voltage at the respective outlet 16. The power server 30 is further operative for supplying the digital data to the respective load 12, 14 via each PLC client 24. The communication between the PLC master 26 and each PLC client 24 could be by a wired or wireless link.

A scheduling controller 36 is also operatively connected to the power server 30 for specifying which of the outlets 16, as well as when the specified outlets 16, are to be supplied with DC voltage, and for further specifying which of the outlets 16, as well as when the specified outlets 16, are to be supplied with the DC voltage and the digital data. For example, some outlets 16 in an office building may be deliberately disconnected from being supplied with power and/or data at night, or on weekends, or on holidays, or on some other schedule, to conserve power usage.

Figure 2:
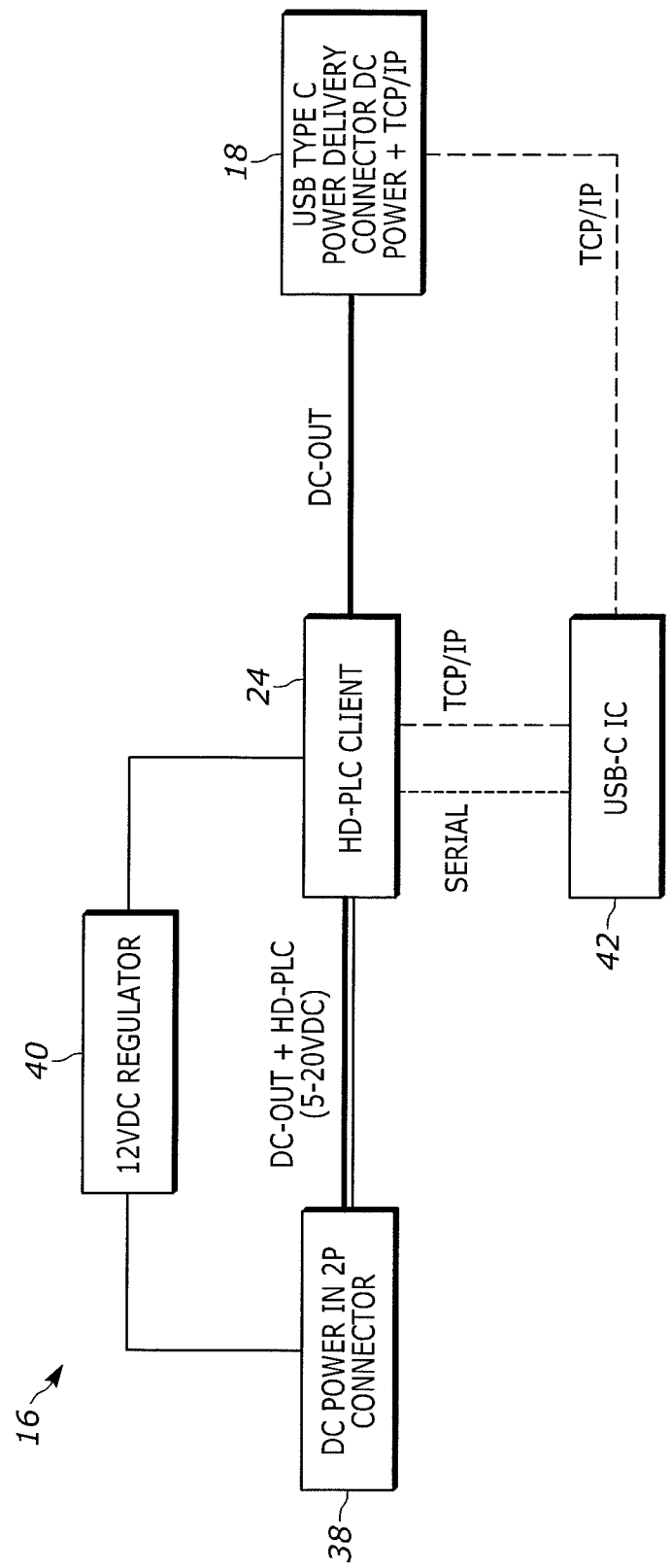
FIG. 2 is a block diagram of one embodiment of the DC outlet of FIG. 1.

Turning to FIG. 2, as mentioned above, the USB-C embodiment of the outlet 16 has the USB-C connector 18 for connection to the smart load 14 requiring both power and data. DC power enters the outlet 16 at a two-pin input connector 38 and is conducted to the PLC client 24. A voltage regulator 40 may also be connected between the connector 38 and the PLC client 24. Digital data is conducted between the PLC client 24 and the USB-C connector 18 via a USB type C integrated circuit chip 42.

Figure 3:
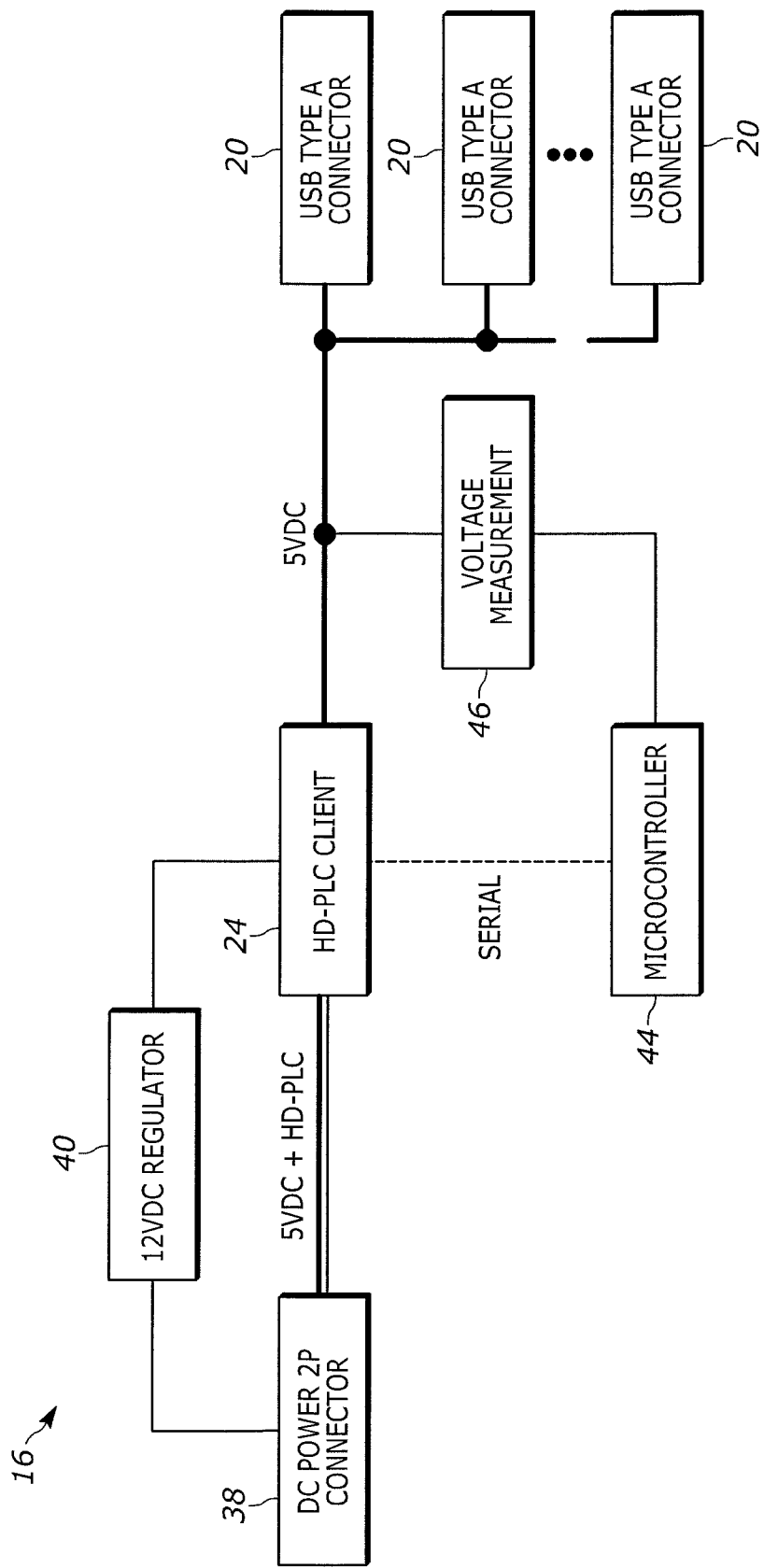
FIG. 3 is a block diagram of another embodiment of the DC outlet of FIG. 1.

Turning to FIG. 3, as mentioned above, the USB-A embodiment of the outlet 16 has one or more USB-A connectors 20 for connection to respective passive loads 12 requiring only power. DC power enters the outlet 16 at the two-pin input connector 38 and is conducted to the PLC client 24. The voltage regulator 40 may also be connected between the connector 38 and the PLC client 24. The DC voltage is conducted between the PLC client 24 and the USB-A connector 20 via a microcontroller 44 and a voltage measurement circuit 46.

Figure 4:
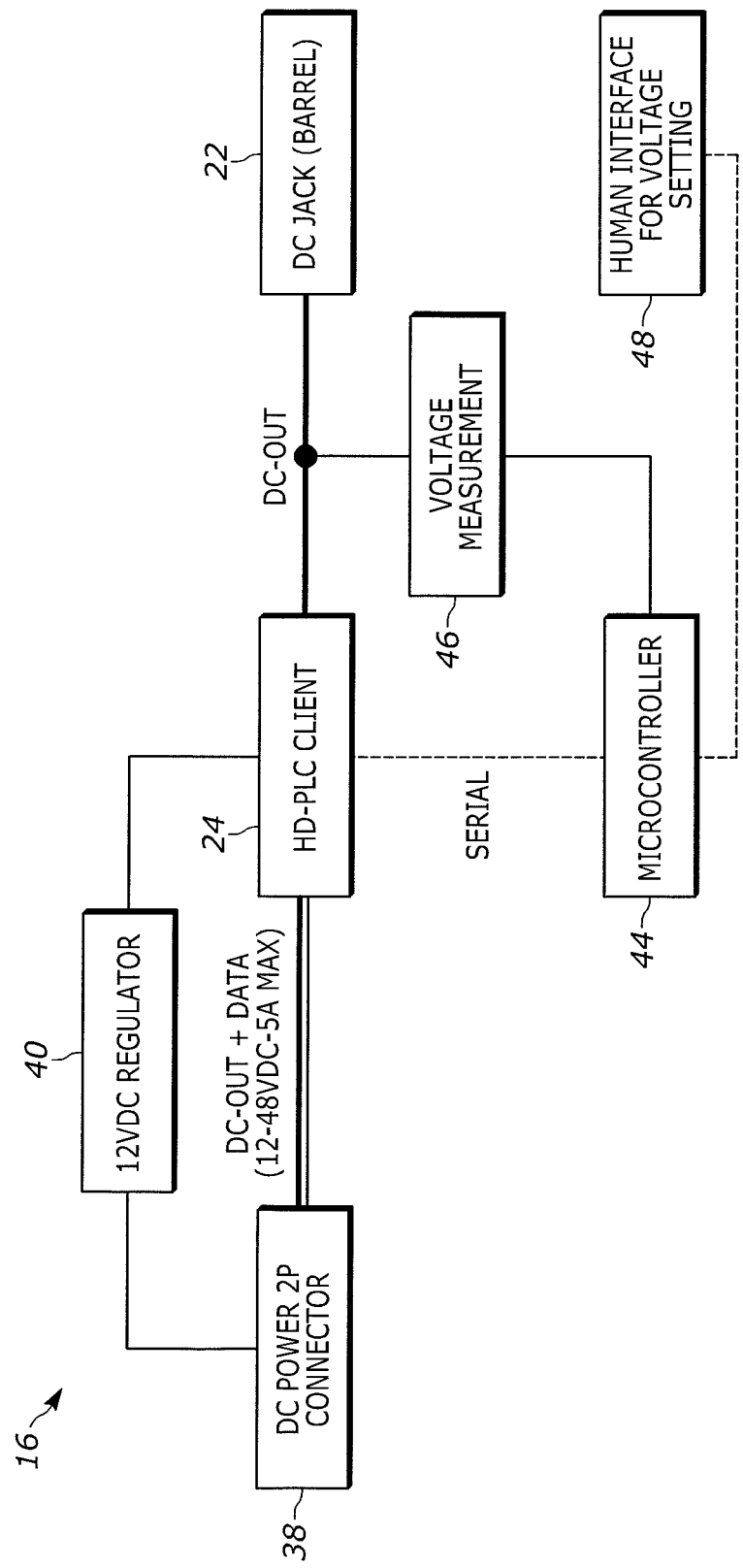
FIG. 4 is a block diagram of still another embodiment of the DC outlet of FIG. 1.

Turning to FIG. 4, as mentioned above, the barrel or DC jack embodiment of the outlet 16 has the barrel connector 22 for connection to the passive load 12 requiring only power. DC power enters the outlet 16 at the two-pin input connector 38 and is conducted to the PLC client 24. The voltage regulator 40 may also be connected between the connector 38 and the PLC client 24. The DC voltage is conducted between the PLC client 24 and the barrel connector 22 via the microcontroller 44 and the voltage measurement circuit 46. A user interface 48 for manually adjustably setting the desired DC voltage for the passive load 12 may also be provided. This interface 48 may be configured with a button or like actuator, or with a wireless smartphone application, or with a USB-B port.

Figure 5:
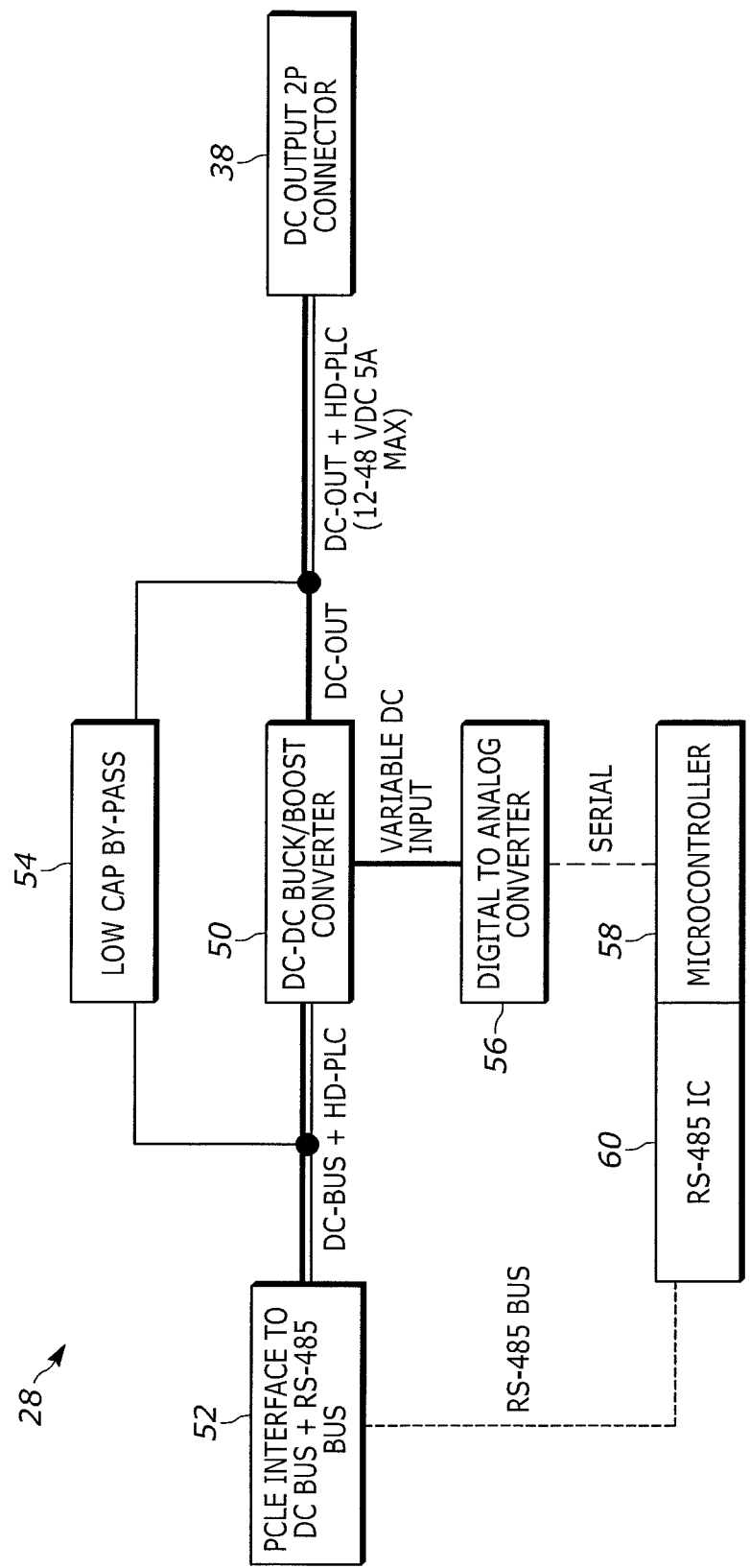
FIG. 5 is a block diagram of the adjustable voltage module of FIG. 1.

FIG. 5 depicts components of each adjustable voltage module 28. A DC-DC buck/boost converter 50 is connected on a DC bus between a PCIe interface 52 and the two-pin input connector 38 of the outlet 16. A bypass capacitor 54 may be connected across the converter 50. An RS-485 integrated circuit chip 60 and a microcontroller 58 may be connected to the PCIe interface 52 on an RS-485 bus. The microcontroller 58 is connected to a digital-to-analog converter 56 to produce a variable DC input signal to adjust the DC voltage, typically in the Class 2 range, being supplied to the outlet 16.

Figure 6:
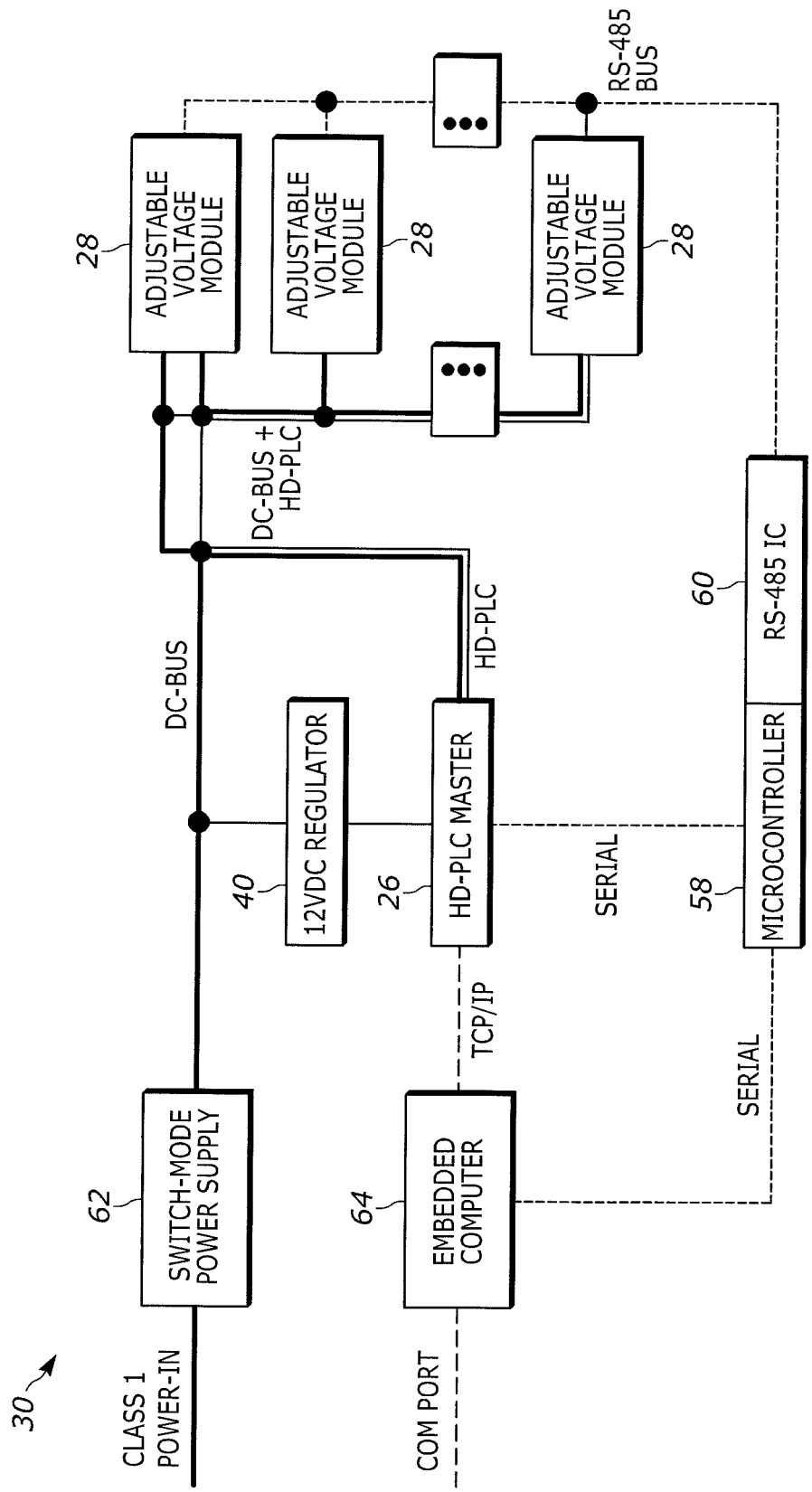
FIG. 6 is a block diagram of the power server of FIG. 1.

FIG. 6 depicts components of the power server 30. DC power from the power source 32 is received by a switch-mode power supply 62 and conducted to the adjustable voltage modules 28. The DC power is also connected to the PLC master 26 via the voltage regulator 40. Data from the data source 34 is received by an embedded computer 64 and may be conducted to the PLC master 26. The RS-485 integrated circuit chip 60 and the microcontroller 58 may be connected to the embedded computer 64, the PLC master 26, and each adjustable voltage module 28, on an RS-485 bus.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, or contains a list of elements does not include only those elements, but may include other elements not expressly listed or inherent to such process, method, article, or apparatus. An element proceeded by "comprises . . . a," "has . . . a," "includes . . . a," or "contains . . . a," does not, without more constraints, preclude the existence of additional identical elements in the process, method, article, or apparatus that comprises, has, includes, or contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 10%, in another embodiment within 5%, in another embodiment within 1%, and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

The invention claimed is:

1. A system for programmably operating a DC load, the system comprising:
   a DC outlet operatively connected to the load;
   a power line communication (PLC) client at the outlet for measuring actual and desired DC voltage at the load; and
   a DC power server located remotely from the outlet and being operatively connected between a DC power source and the outlet, the power server having a PLC master in bidirectional feedback communication with the PLC client to determine the actual and desired DC voltage at the load, the power server further having an adjustable DC voltage module controlled by the PLC master to supply an adjustable DC voltage, the power server being operative for adjusting the DC voltage supplied by the voltage module to the load based on the bidirectional feedback communication between the PLC master and the PLC client.

2. The system of claim 1, wherein the outlet has at least one of a USB-C connector, a USB-A connector, and a barrel connector.

3. The system of claim 1, wherein the PLC master and the PLC client each operate under the high definition (HD) PLC protocol.

4. The system of claim 1, wherein the voltage module includes a DC-to-DC converter.

5. The system of claim 1, wherein the outlet has a user interface for manually adjustably setting the desired DC voltage for the load.

6. The system of claim 1, wherein the power server is operatively connected to a data source for supplying digital data, and wherein the power server is further operative for supplying the digital data to the load via the PLC client.

7. The system of claim 6, further comprising additional DC outlets operatively connected to respective DC loads, and additional PLC clients at the respective outlets; and wherein the power server has additional adjustable DC voltage modules operatively connected to the respective outlets for adjusting the DC voltage supplied by each voltage module to a respective load based on the bidirectional feedback communication between the PLC master and the respective PLC client.

8. The system of claim 7, wherein at least one of the loads is a passive load requiring the DC voltage for its operation, and wherein at least another of the loads is an active load requiring both the DC voltage and the digital data for its operation.

9. The system of claim 8, further comprising a controller operatively connected to the power server for (i) specifying which of the outlets are to be supplied with DC voltage and when said specified outlets are to be supplied with DC voltage, and (ii) further specifying which of the outlets are to be supplied with DC voltage and digital data and when said further specified outlets are to be supplied with DC voltage and digital data.

10. A method of programmably operating a DC load, the method comprising:
- operatively connecting a DC outlet to the load;
- measuring actual and desired DC voltage at the load with a power line communication (PLC) client at the outlet;
- locating a DC power server remotely from the outlet;
- operatively connecting the power server between a DC power source and the outlet;
- determining the actual and desired DC voltage at the load with a PLC master at the power server and in bidirectional feedback communication with the PLC client;
- supplying an adjustable DC voltage from an adjustable DC voltage module controlled by the PLC master; and
- adjusting the DC voltage supplied by the voltage module to the load based on the bidirectional feedback communication between the PLC master and the PLC client.

11. The method of claim 10, further comprising configuring the outlet with at least one of a USB-C connector, a USB-A connector, and a barrel connector.

12. The method of claim 10, further comprising configuring the PLC master and the PLC client to each operate under the high definition (HD) PLC protocol.

13. The method of claim 10, further comprising configuring the voltage module with a DC-to-DC converter.

14. The method of claim 10, further comprising configuring the outlet with a user interface for manually adjustably setting the desired DC voltage for the load.

15. The method of claim 10, further comprising operatively connecting the power server to a data source for supplying digital data, and supplying the digital data to the load via the PLC client.

16. The method of claim 15, further comprising operatively connecting additional DC outlets to respective DC loads, and providing additional PLC clients at the respective outlets; and operatively connecting additional adjustable DC voltage modules to the respective outlets for adjusting the DC voltage supplied by each voltage module to a respective load based on the bidirectional feedback communication between the PLC master and the respective PLC client.

17. The method of claim 16, further comprising configuring at least one of the loads as a passive load requiring the DC voltage for its operation, and configuring at least another of the loads as an active load requiring both the DC voltage and the digital data for its operation.

18. The method of claim 17, further comprising (i) specifying which of the outlets are to be supplied with DC voltage and when said specified outlets are to be supplied with DC voltage, and (ii) further specifying which of the outlets are to be supplied with DC voltage and digital data and when said further specified outlets are to be supplied with DC voltage and digital data.

* * * * *